(12) United States Patent
Benedict et al.

(10) Patent No.: US 11,937,373 B2
(45) Date of Patent: Mar. 19, 2024

(54) WIDEBAND ROUTING TECHNIQUES FOR PCB LAYOUT

(71) Applicant: Hewlett Packard Enterprise Development LP, Houston, TX (US)

(72) Inventors: Melvin K. Benedict, Magnolia, TX (US); Paul Danna, Pearland, TX (US); Chi Kim Sides, Spring, TX (US); Wayne Vuong, Cypress, TX (US); Michael Chan, Bellaire, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/689,611

(22) Filed: Mar. 8, 2022

(65) Prior Publication Data
US 2023/0292436 A1   Sep. 14, 2023

(51) Int. Cl.
*H05K 1/02* (2006.01)
*H05K 1/11* (2006.01)

(52) U.S. Cl.
CPC ........... *H05K 1/115* (2013.01); *H05K 1/0222* (2013.01); *H05K 1/0245* (2013.01); *H05K 1/0251* (2013.01); *H05K 1/0298* (2013.01); *H05K 1/116* (2013.01); *H05K 2201/09263* (2013.01); *H05K 2201/09609* (2013.01)

(58) Field of Classification Search
CPC ................. H05K 1/115; H05K 1/0298; H05K 2201/09263; H05K 2201/09609; H05K 1/0222; H05K 1/0245; H05K 1/0251; H05K 1/116
See application file for complete search history.

(56) References Cited

U.S. PATENT DOCUMENTS

| | | | | |
|---|---|---|---|---|
| 3,895,181 A | * | 7/1975 | LaGrange | H05K 1/0228 439/43 |
| 7,040,013 B1 | * | 5/2006 | Jochym | H05K 1/112 29/850 |
| 2009/0188711 A1 | * | 7/2009 | Ahmad | H05K 1/116 174/262 |
| 2018/0293345 A1 | * | 10/2018 | Shen | H05K 1/115 |

* cited by examiner

*Primary Examiner* — Ishwarbhai B Patel
(74) *Attorney, Agent, or Firm* — Yao Legal Services, Inc.

(57) ABSTRACT

One aspect of the instant application provides techniques to reduce the amount of crosstalk on single-ended signals in the pin field region of an integrated circuit device on a printed circuit board (PCB). The PCB can include a plurality of layers and an array of vias comprising a plurality of rows configured to route signals across layers. An inner layer of the PCB can include first and second signal traces positioned between first and second adjacent rows of the vias, the first signal trace positioned adjacent to the first row and the second signal trace positioned adjacent to the second row. The first signal trace can include at least one curved segment that curves around a substantial portion of a corresponding via in the first row such that separation between the first and second signal traces varies along the curved segment.

21 Claims, 7 Drawing Sheets

WIDEBAND ROUTING TECHNIQUES FOR PCB LAYOUT

BACKGROUND

This disclosure is generally related to the design of signal routings on a printed circuit board (PCB). More specifically, this disclosure is related to routing techniques of wideband signal paths within the escape region of an integrated circuit device on a PCB.

BRIEF DESCRIPTION OF THE FIGURES

In the figures, like reference numerals refer to the same figure elements.

DETAILED DESCRIPTION

Figure 1:
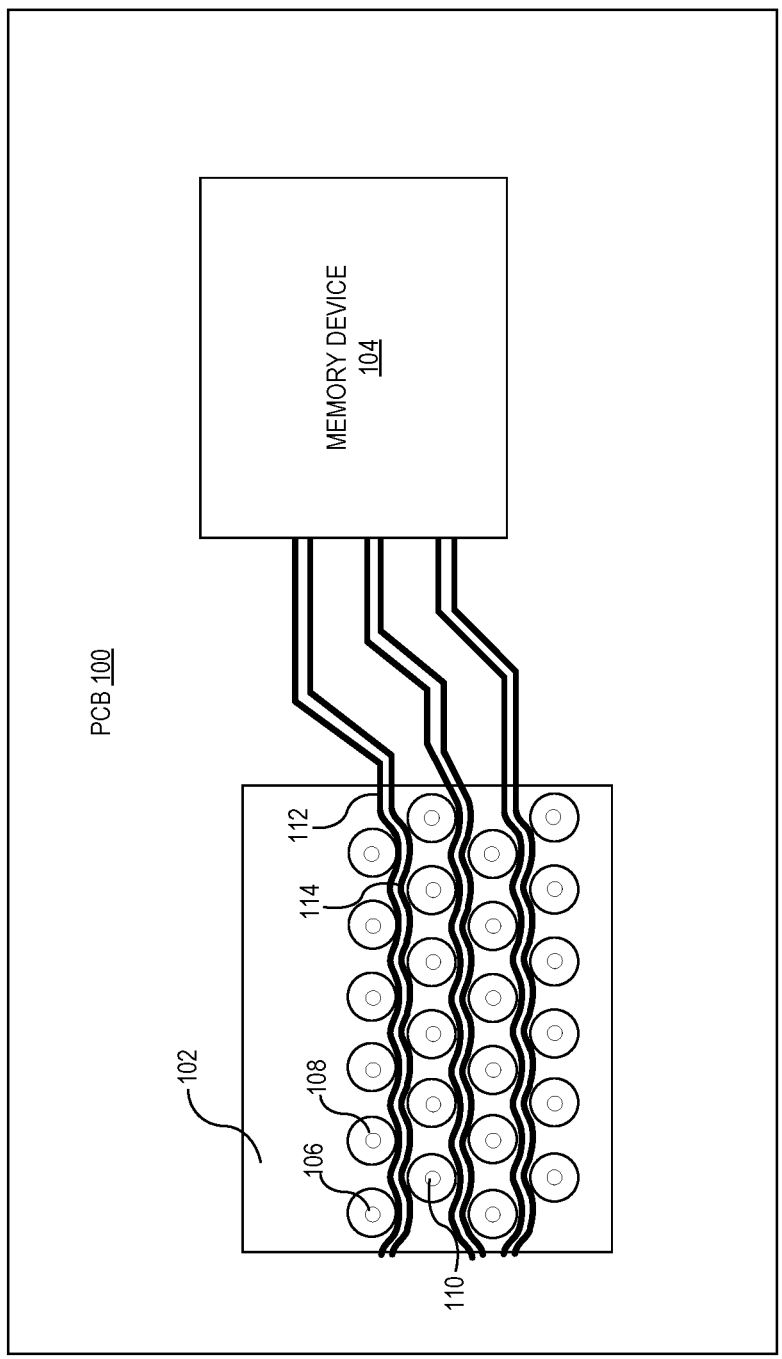
FIG. 1 illustrates a plurality of high-speed signal traces escaping the pin field's via array of a system on a chip (SOC) device.

The following description is presented to enable any person skilled in the art to make and use the examples and is provided in the context of a particular application and its requirements. Various modifications to the disclosed examples will be readily apparent to those skilled in the art, and the general principles defined herein may be applied to other examples and applications without departing from the spirit and scope of the present disclosure. Thus, the scope of the present disclosure is not limited to the examples shown but is to be accorded the widest scope consistent with the principles and features disclosed herein.

The disclosure provides a solution for routing wideband single-ended signal traces escaping from a surface-mount integrated circuit device, such as a ball grid array (BGA) package or a land grid array (LGA) package. According to a first aspect, a pair of single-ended signal traces can be arranged between two adjacent rows of the via array of the integrated circuit device. The spacing between the two single-ended signal traces can be modulated by adding extra lengths to one of the two signal traces (e.g., the upper signal trace). More specifically, an additional length can be added to the signal trace at each location between two adjacent via antipads, such that the signal trace is routed away from the other signal trace at that location. This added length increases the separation between the signal traces, thus reducing crosstalk between the signal traces. According to a second aspect, additional lengths can be added to both signal traces to increase the overall separation without causing a significant length difference between the two signal traces. According to a third aspect, the signal traces can be routed closer to the ground vias, because the reference planes do not have via antipads. This can increase the separation between signal traces at locations adjacent to the ground vias and can break the repetitive periodic structure of the escape routing, thus further reducing the amount of crosstalk between signal traces. In addition, the width of the signal traces can be widened at locations between adjacent via antipads to lower the impedance of the single-ended signal traces.

The developments in system on a chip (SOC) technologies have resulted in an increased number of high-speed input/output (I/O) channels and an increased number of memory channels. In general, the number of signals increases for each newer generation of SOC. This can lead to an increased SOC package size, thus increasing the length of signal paths in the pin field region on the PCB under the SOC package, which can be a BGA or LGA package.

The increased path length can negatively affect the quality of signals propagating along the path, especially high-speed signals. For example, a typical SOC can have a number of single-ended high-speed/wideband signal channels, such as double data rate 4 or 5 (DDR4 or DDR5) memory channels. Note that a DDR5 memory channel can support data rates of thousands mega-transfers-per second (MT/s), requiring a channel bandwidth that is well beyond 3 GHz. When multiple (e.g., two) such high-speed signals are routed parallel to each other for an electrically significant distance (e.g., a distance longer than the distance travelled by the rise time of the signal), the long coupling length and the effect of adjacent pads or vias can adversely affect the signal quality with increased crosstalk and frequency-dependent impedance changes.

FIG. 1 illustrates a plurality of high-speed signal traces escaping the pin field's via array of an SOC device. In FIG. 1, a partial top view of a PCB 100 is shown. PCB 100 can be a multi-layer PCB and can include a number of devices mounted on its surface, including an SOC device 102 and a memory device 104. SOC device 102 and memory device 104 can be interconnected by a number of single-ended high-speed signal traces. SOC device 102 can be a BGA package or an LGA package that includes an array of pins. Note that only a portion of PCB 100 is shown in FIG. 1. FIG. 1 also shows an array of vias (e.g., vias 106, 108, and 110) positioned beneath SOC device 102. Including vias in PCB 100 allows signal traces (e.g., traces 112 and 114) on an internal PCB signal routing layer to be connected to pins/pads of SOC device 102. The existence of the via array also complicates the routing of signal traces escaping from the pin field of SOC device 102. More specifically, the signal traces have to be routed in the spacing between adjacent rows of the vias, referred to as a routing channel. As shown in FIG. 1, signal traces 112 and 114 are routed in a channel between the top row of the via array and the second row of the via array.

In the example shown in FIG. 1, the via array is arranged in a staggered fashion, with adjacent rows of vias shifted in position. For example, vias 106 and 108 are in the same row, via 110 is in an adjacent row, and instead of being aligned with via 106 or 108, via 110 is aligned with the midpoint between vias 106 and 108. Note that the pattern of via array follows the pattern of the contact pins/pads of the package (which are not shown in FIG. 1). The staggered array of pins/pads allows for a tighter density of the pin field. At the same time, the tightly arranged pins/pads and vias can make escape routing more challenging. Compared with an un-staggered array, the width of the routing channel (i.e., the space between two adjacent rows) can be much smaller, meaning that the distance between the pair of single-ended signal traces in each channel (e.g., traces 112 and 114) can be smaller.

In the example shown in FIG. 1, the pair of signal traces in each routing channel are substantially running in parallel with each other, which can possibly lead to a significant amount of crosstalk. As the size of SOC device 102 increases (e.g., due to an increased count of memory channels), lengths of the signal traces (e.g., traces 112 and 114) that need to escape from the pin field of SOC device 102 also increase, thus leading to increased crosstalk between these adjacent signal traces. To reduce crosstalk, according to one aspect of the instant application, signal traces in a routing channel can be routed differently from what is shown in FIG. 1. More specifically, in addition to the space between adjacent rows of vias, a routing channel can also use the empty space between adjacent vias in the same row to route signal traces.

Figure 2:
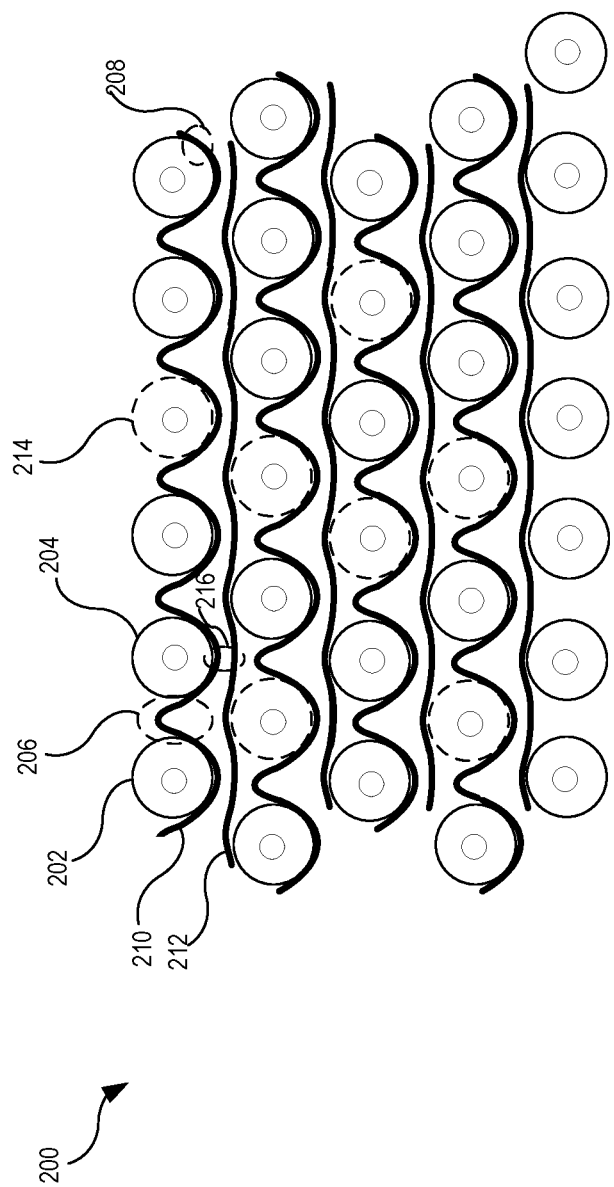
FIG. 2 illustrates a plurality of high-speed signal traces routed through a via array, according to one aspect of the instant application.

FIG. 2 illustrates a plurality of high-speed signal traces routed through a via array, according to one aspect of the instant application. In FIG. 2, a particular signal trace layer 200 can include a plurality of signal traces and an array of via antipads. Note that the term "via antipads" typically refers to the voids on the reference metal layers of a PCB. Signal traces should not be routed over the void on the reference plane to preserve signal integrity. Because this "keep-out" region can be defined by the outer diameter of the corresponding via antipad on the reference plane, we can also use the term "via antipad" to describe the area on the signal plane where the signal traces cannot be routed due to the existence of a via.

FIG. 2 shows an array of via antipads, including via antipads 202 and 204. Note that the outer circle defines the outer boundary of the via antipad and the inner circle is the actual hole of the via. The via pad is not shown in FIG. 2. In FIG. 2, a number of antipads (e.g., via antipad 214) are shown to have their outer boundary represented using a dashed circle. These dashed via antipads correspond to ground vias. We use the dashed circle to mark the region around a ground via that is similar to the via antipad region of a signal via, because ground vias in fact do not have via antipads on the ground reference plane. However, in the example shown in FIG. 2, the ground vias (which are vias connected to the ground plane) and signal vias (which carry signals) are treated similarly, meaning that signal traces are routed around the signal vias and ground vias in a similar fashion.

As discussed previously, signal traces need to be routed in the routing channel between adjacent rows of via antipads, and the long coupling length between the pair of signal traces (e.g., traces 112 and 114 shown in FIG. 1) can increase crosstalk. To mitigate the crosstalk between the signal traces, according to one aspect of the instant application, additional lengths can be added to at least one of the pair of signal traces within each routing channel. The additional length can be added at locations around the perimeter of each via antipad and at locations between adjacent via antipads in the same row, such that the signal trace can wrap around (or "hug") a substantial portion of each via antipad.

In the example shown in FIG. 2, additional lengths can be added to signal trace 210 at a number of locations (e.g., locations 206 and 208) such that signal trace 210 is routed to wrap around or curve along a substantial portion (e.g., up to 50%) of the perimeter of each via antipad. This means that signal traces 210 and 212 no longer run substantially in parallel with each other. This also means that a significant portion (e.g., the portion at location 206) of signal trace 210 has been extended outside of the conventional routing channel between the adjacent rows of the via antipads. On the other hand, signal trace 212 mostly remains within the conventional routing channel.

The added length to signal trace 210 can periodically increase the separation between signal traces 210 and 212. As shown in FIG. 2, the separation between signal traces 210 and 212 can be of a minimum value at a location (e.g., location 216) between adjacent via antipads of the row adjacent to signal trace 212 and can reach a maximum value at a location (e.g., location 206) between two adjacent via antipads of the row adjacent to signal trace 210. More specifically, at locations where the spacing between the adjacent signal traces (e.g., traces 210 and 212) is increased, the coupling between signals propagating along the signal traces can be reduced, thus reducing the overall crosstalk. In general, the signal to noise ratio (SNR) of the propagated signals can be improved. In some cases, the SNR can be improved between 5% and 10%.

According to one aspect, one can select, between the pair of signal traces in the same routing channel, a signal trace with an overall shorter distance to add length (or cause the shorter signal trace to curve around the outer boundary of each via antipad). This way, the overall difference in lengths between the signal traces can be kept relatively small. If the length of a selected signal trace needs to match the length of a different signal trace on the same PCB, additional length compensation schemes can be used at areas outside of the footprint of the SOC.

Figure 3:
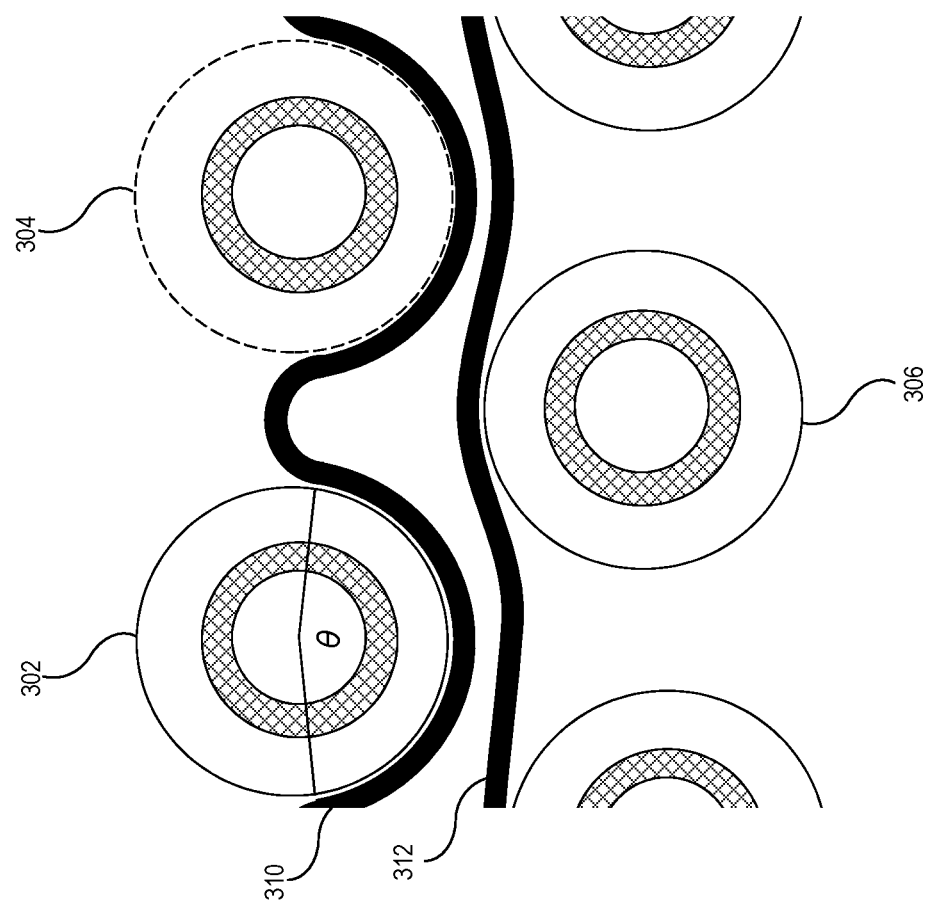
FIG. 3 illustrates an amplified view of the via antipads and signal traces, according to one aspect of the instant application.

FIG. 3 illustrates an amplified view of the via antipads and signal traces, according to one aspect of the instant application. In FIG. 3, a signal via antipad 302 and a ground via antipad 304 are adjacent via antipads in the same row, and a signal via antipad 306 is in an adjacent row and positioned between via antipads 302 and 304. In addition to the outer boundary of each via antipad, FIG. 3 also shows the hole (e.g., the innermost circle) and the via pad (e.g., the cross-hatched region) of each via.

Signal traces 310 and 312 are shown to be routed along a routing channel between the two rows of via antipads. More specifically, starting from a point on the perimeter of via antipad 302, signal trace 310 is routed to wrap around or curve along a significant portion (which can be up to 50%, e.g., between 25% and 50% or between 40% and 50%) of via antipad 302 before it is routed away from via antipad 302. According to one aspect, the arc angle (e.g., $\theta$) of the wrapped portion of the perimeter of the via antipad can be between $\pi/2$ (or 90°) and $\pi$ (or 180°). The greater the $\theta$, the greater the separation between signal traces 310 and 312. According to one aspect, the distance between the edge of signal trace 310 and the outer boundary of a corresponding via antipad can be kept minimum (e.g., kept at a value according to the fabrication tolerance) to prevent signal trace 310 from entering the via antipad region while keeping signal trace 310 as far as possible away from signal trace 312.

FIG. 3 also shows that, from its lowest point, as signal trace 310 is routed along the edge of via antipad 302 and then away from via antipad 302, the separation between signal traces 310 and 312 increases. The separation value reaches its maximum value substantially at the midpoint between via antipads 302 and 304. Starting from the midpoint, signal trace 310 turns back and is routed toward via antipad 304, wrapping around or curving along a portion of the perimeter of via antipad 304. Note that, to increase the separation between signal traces 310 and 312, it is desirable to route signal trace 310 away from signal trace 312 as much as possible. However, because signal traces cannot be routed over regions occupied by the via antipads (e.g., via antipads 302 and 304), routing signal trace 310 along (or immediately adjacent to) the perimeter of the via antipads can in fact provide the maximum amount of separation. Also note that, at the midpoint between via antipads 302 and 304, one can increase the separation by routing signal trace 310 further away from signal trace 312. However, one also needs to consider the distance between signal trace 310 and another signal trace within an adjacent routing channel. According to one aspect, the separation between adjacent signal traces within the same routing channel at the midpoint can be determined to ensure that the separation between adjacent signal traces of adjacent routing channels is no less than a predetermined threshold value.

In the example shown in FIGS. 2 and 3, the pair of signal traces in the routing channel are routed asymmetrically. This scheme can maximize the separation between the signal traces at certain locations (e.g., at midpoints between adjacent via antipads in the same row). However, this asymmetrical routing scheme may result in a significant difference in lengths between the signal traces, which can sometimes be problematic. To reduce the trace length difference while reducing signal crosstalk, according to one aspect, signal traces in each routing channel can be routed substantially symmetrically.

Figure 4:
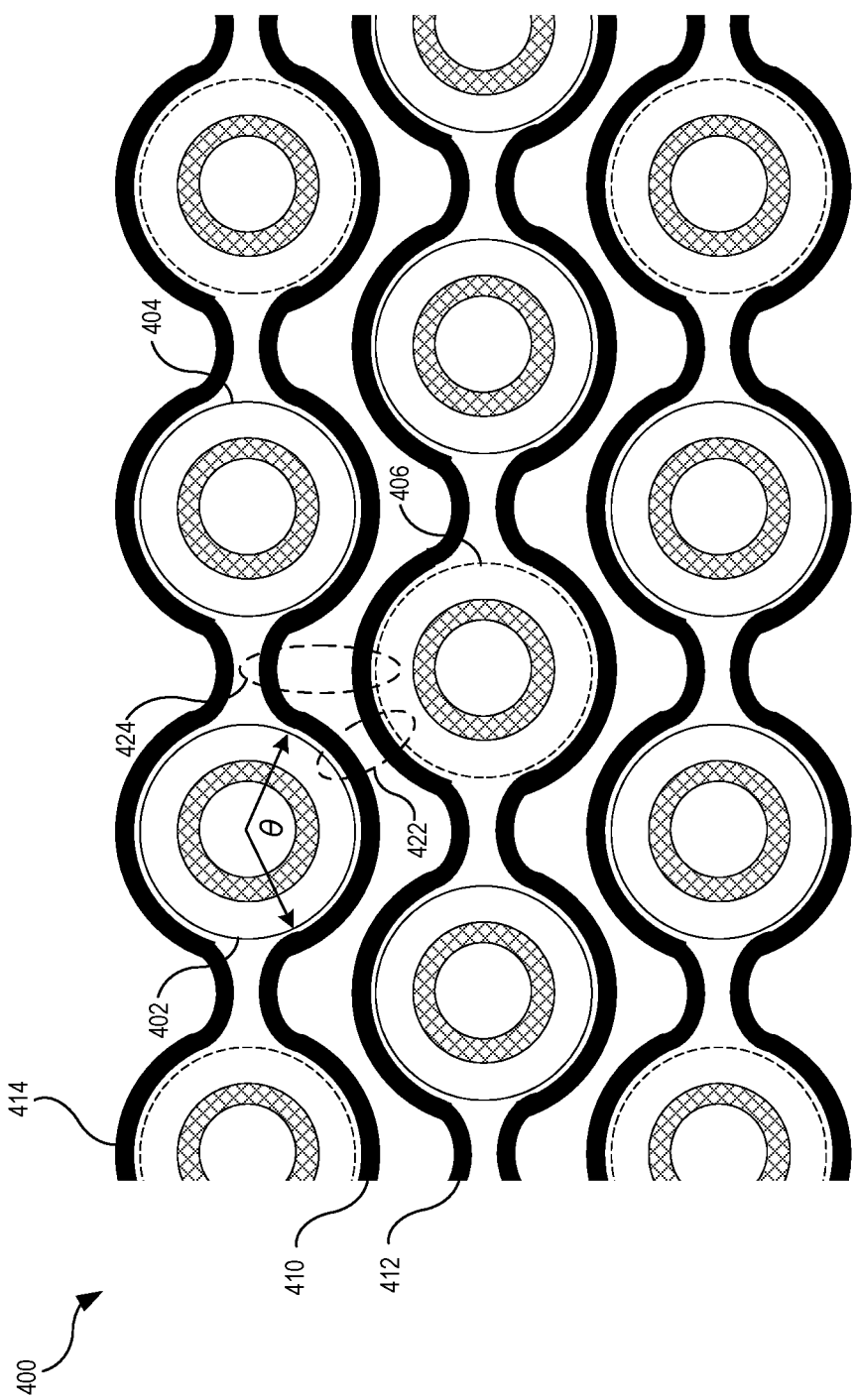
FIG. 4 illustrates symmetrical routing of signal traces, according to one aspect of the instant application.

FIG. 4 illustrates symmetrical routing of signal traces, according to one aspect of the instant application. In FIG. 4, a signal plane 400 includes an array of via antipads (e.g., via antipads 402, 404, and 406) and a number of signal traces (e.g., traces 410 and 412). More specifically, via antipads 402 and 404 are positioned in a top row, via antipad 406 is positioned in a second row, and signal traces 410 and 412 are routed in a routing channel between the top row and the second row. Note that a conventional routing channel is mostly confined to the empty space between adjacent rows (e.g., as the example shown in FIG. 1), whereas the routing channel in this disclosure also includes the empty space between adjacent via antipads in the same row. For example, the empty space between via antipads 402 and 404 can now be used to route signal traces.

Compared with the signal traces shown in FIGS. 1-3, in FIG. 4, both signal traces in each routing channel have their length added such that each signal trace can include segments that wrap around a substantial portion of a via antipad. For example, signal trace 410 includes a segment that curves around a portion of the perimeter of via antipad 402 and a segment that curves around a portion of the perimeter of via antipad 404. In addition, signal trace 412 includes a segment that curves around a portion of the perimeter of via antipad 406. This can result in a via antipad having two contiguous portions of its perimeter being wrapped (or "hugged") by signal traces. For example, via antipad 402 can have an upper portion of its perimeter wrapped by a signal trace 414 and a lower portion of its perimeter wrapped by signal trace 410.

In the example shown in FIG. 4, as each signal trace curves around the via antipads of an adjacent row, the separation between the two signal traces in the routing channel varies. According to one aspect of the instant application, the signal traces are closest to each other at a location where the via antipads of adjacent rows (e.g., via antipads 402 and 406) are closest to each other. In the example shown in FIG. 4, signal traces 410 and 412 are closest to each other at a location 422, which can be along a straight line connecting the centers of via antipads 402 and 406. According to one aspect, the smallest distance between signal traces 410 and 412 should be greater than twice or three times the width of signal traces 410 and 412. The signal traces are farthest from each other at the midpoint between adjacent via antipads in the same row. For example, signal traces 410 and 412 are farthest from each other at a location 424, which can be roughly at the midpoint between adjacent via antipads 402 and 404. Like what is shown in FIG. 3, the maximum separation between the signal traces in one routing channel is also constrained by the signal trace in the adjacent routing channel. For example, the separation between signal traces 410 and 412 at location 424 can be constrained by the separation between signal traces 410 and 414 at the same location. Increasing the separation between signal traces 410 and 412 at location 424 can lead to the reduced separation between signal traces 410 and 414, which can be problematic as it can increase the crosstalk between signal traces 410 and 414. Note that adjacent signal traces in adjacent routing channels (e.g., traces 410 and 414) are mostly separated from each other by the via antipads and, hence, the separation between them at the space between adjacent via antipads determines the crosstalk between them. According to one aspect, at the midpoint between adjacent vias (e.g., at location 424), the inner-channel separation (e.g., separation between adjacent signal traces in the same routing channel) and the inter-channel separation (e.g., separation between adjacent signal traces in adjacent routing channels) can be similar. According to an alternative aspect, at the midpoint between adjacent vias (e.g., at location 424), the inner-channel separation can be greater (e.g., 20% more) than the inter-channel separation. This is because, in general, the inner-channel crosstalk is greater than the inter-channel crosstalk and there is a greater need to ensure sufficient separation between signal traces in the same routing channel.

In the example shown in FIG. 3, signal trace 310 wraps around about 50% of each via antipad, and the arc angle $\theta$ can be roughly $\pi$ or 180°. This can result in signal trace 310 rising above the center of via antipad 302, thus increasing the separation between signal traces 310 and 312. However, such an arrangement can cause problems in the example shown in FIG. 4. More specifically, if signal trace 410 rises above the center of via antipad 402, it may get too close to signal trace 414, which wraps around an upper portion of via antipad 402. In the most extreme case, signal traces 410 and 414 each wrap 50% of via antipad 402, which can result in signal traces 410 and 414 coming into contact or crossing paths with each other. To prevent excessive inter-channel crosstalk, according to one embodiment, the portion of the via antipad perimeter wrapped by a signal trace can be up to 40%, such as between 0% and 40% or between 20% and 40%.

In FIG. 4, the amount of wrapping around of the via antipads by the two signal traces can be substantially similar. For example, signal trace 410 wraps about 40% of each via antipad in the top row (e.g., via antipads 402 and 404), and signal trace 412 similarly wraps about 40% of each via antipad in the second row (e.g., via antipad 406). This arrangement can ensure increased trace separation, without adding differential length between the signal traces. In other words, the length of each signal trace within the SOC footprint can be kept substantially similar. However, this may also cause the phase delay of the coupled signal to vary periodically. To prevent the periodic varying of the phase delay, according to one aspect, the two signal traces in each routing channel can have different wrapping depths around the via antipads. For example, signal trace 410 can wrap about 40% of each via antipad in the top row, whereas signal trace 412 only wraps about 30% of each via antipad in the second row.

In the previous discussion, we have treated all vias, including both the signal vias and the ground vias, similarly. On the signal plane, signal traces are routed around a via antipad region surrounding each via. For a signal via, the location and size of a via antipad region in the signal plane correspond to the location and size of the actual via antipad on the ground reference plane. On the other hand, a ground via does not have a via antipad on the ground reference plane. However, in the examples shown in FIGS. 2-4, signal traces are routed around the ground vias as if each ground via has a via antipad region similar to that of a signal via. This makes the process of laying out the signal traces simpler. However, because the signal traces have a periodic structure, high-frequency filtering may occur, leading to frequency-dependent impedance changes or unwanted signal reflection.

Figure 5:
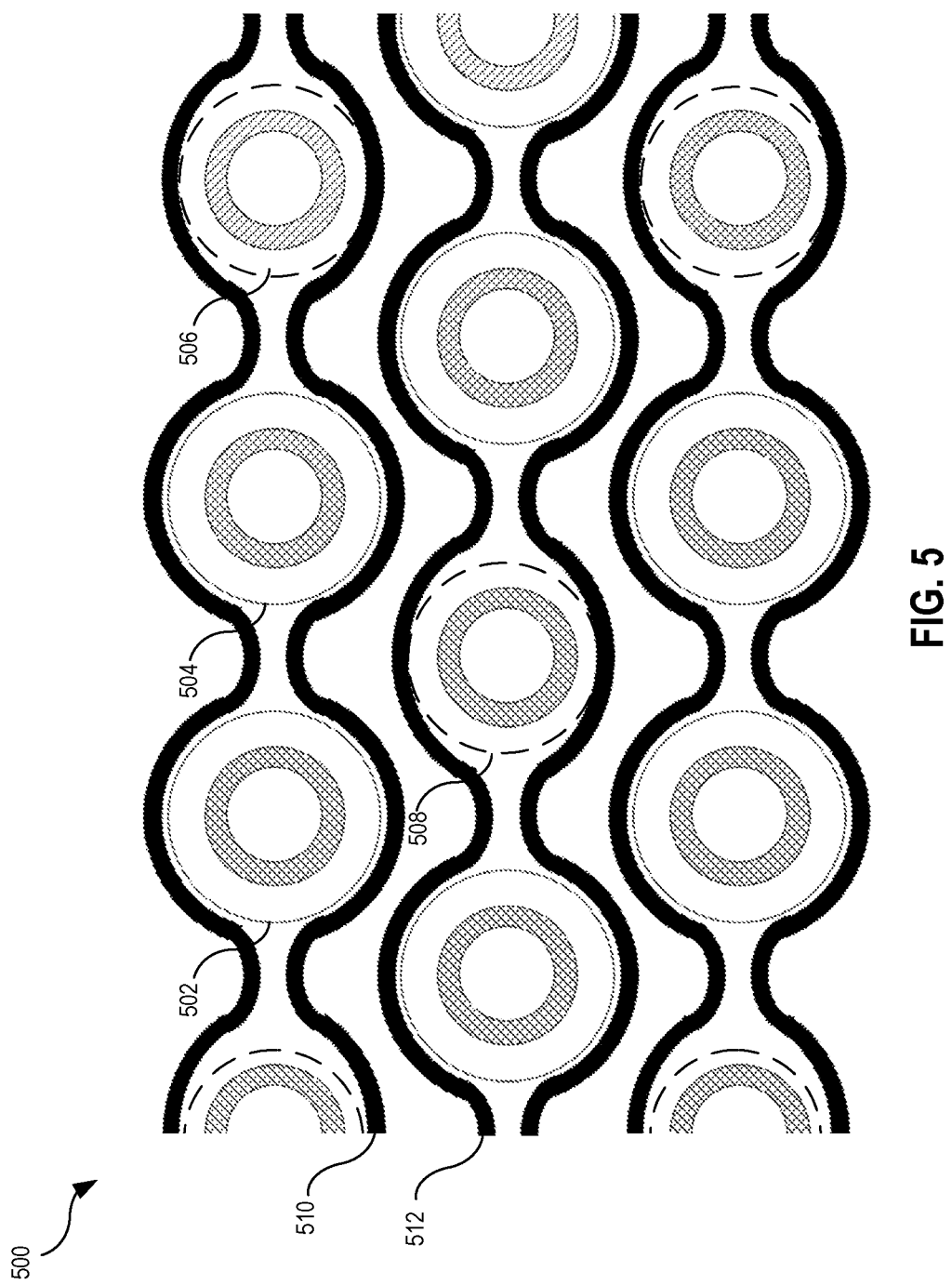
FIG. 5 illustrates routing of signal traces around signal vias and ground vias, according to one aspect of the instant application.

According to one aspect of the instant application, one can take advantage of the fact that the ground vias do not actually have via antipads in the ground reference plane and can treat the ground vias and signal vias differently by allowing the signal traces to be routed closer to the ground vias. FIG. 5 illustrates routing of signal traces around signal vias and ground vias, according to one aspect of the instant application. In FIG. 5, a signal plane 500 includes an array of via antipads (e.g., via antipads 502-508) and a number of signal traces (e.g., traces 510 and 512). For each via antipad, the inner circle represents the hole and the cross-hatched region represents the via pad. Via antipads 502 and 504 are associated with signal vias, with their outer boundary (represented as a solid circle) defined by the corresponding via antipads in the reference plane. On the other hand, via antipads 506 and 508 are associated with ground vias, which do not have via antipads in the signal plane. The outer boundary of via antipads 506 and 508 are determined by how close a signal trace can be routed around the via pad of the corresponding ground via. In general, signal traces can be routed closer to the ground vias than to the signal vias, meaning that equivalent via antipads for the ground vias (e.g., ground via antipads 506 and 508) are smaller than via antipads of signal vias (e.g., signal via antipads 502 and 504).

In FIG. 5, the signal vias and ground vias are treated differently, with the signal via antipads shown to be greater than the ground via antipads. FIG. 5 also shows that each signal trace is routed around a substantial portion of each signal via antipad and a substantial portion of the ground via antipad. More specifically, the signal trace is routed closer to the ground vias than to the signal vias. For example, signal trace 510 wraps around a portion of each of via antipads 502, 504, and 506, and the distance between signal trace 510 and the via pad of signal via antipad 502 or 504 is greater than the distance between signal trace 510 and the via pad of ground via antipad 506.

Because the ground vias are somewhat randomly scattered around in the via array, routing the signal traces around signal vias and ground vias differently can break the repetitive periodic structure of the escape routing, thus reducing the high-frequency filtering effect. Moreover, routing the signal trace closer to the ground vias also increases the separation between the signal traces at such locations. For example, because signal trace 512 is routed closer to the ground via of ground via antipad 508, the separation between signal traces 510 and 512 can be greater at the location adjacent to ground via antipad 508 than at a location adjacent to a signal via antipad.

Due to the space constraints of the escape routing, the signal traces are designed to be narrow. For example, the width of the signal traces escaping from the SOC footprint can be about four mils. These narrow traces could have potentially high impedance, which is undesirable. To reduce the impedance of the signal traces, according to one aspect, at locations where the separation between signal traces is relatively large, one or both signal traces can be widened. For example, one or both of the signal traces can be widened at a location where the separation between the signal traces reaches a maximum value.

Figure 6:
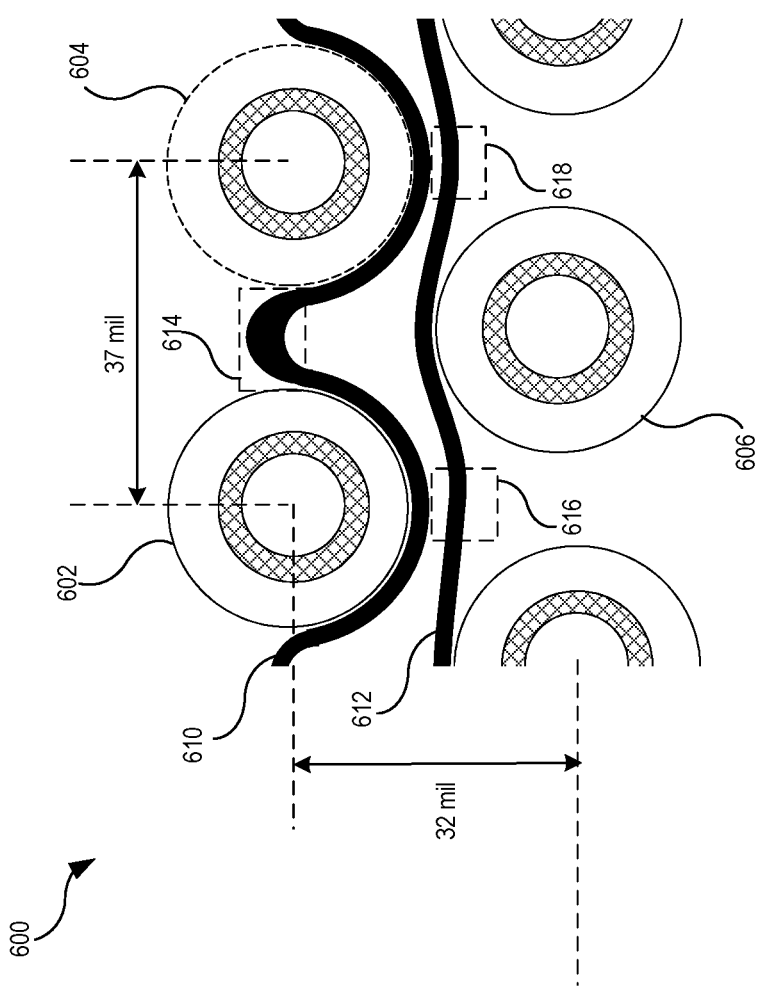
FIG. 6 illustrates signal traces with widened segments, according to one aspect of the instant application.

FIG. 6 illustrates signal traces with widened segments, according to one aspect of the instant application. In FIG. 6, signal plane 600 can include two rows of via antipads, with via antipads 602 and 604 positioned in the top row and via antipad 606 positioned in the bottom row. FIG. 6 also shows signal traces 610 and 612 positioned in the routing channel between the top row and the bottom row. The escape routing scheme shown in FIG. 6 can be similar to what is shown in FIGS. 2 and 3, where only one of the signal traces (e.g., signal trace 610) in the routing channel is routed around a substantial portion of each via antipad. Like in FIG. 3, the separation between signal traces 610 and 612 can be the greatest at the midpoint between via antipads 602 and 604. This relatively large separation allows signal trace 610 to include a widened segment 614 at this location. According to one aspect, widened segment 614 can be tapered.

In the example shown in FIG. 6, only one of the signal traces includes widened segments. In practice, both signal traces can include widened segments. For example, although not shown as being widened, it is also possible for signal trace 612 to have widened segments at locations between adjacent via antipads (e.g., locations 616 and 618). According to one aspect, the widened segments can also be randomly placed in the escape routing paths to further break up the periodicity of the escape routing, thus reducing the high-frequency filtering effect.

FIG. 6 also illustrates exemplary row pitch and column pitch of the via array. The density of the via array and the size of the individual vias can determine the amount of wrapping around of the via antipad needed to achieve the desired separation (e.g., the desired separation at the midpoint between adjacent vias in a row).

Figure 7:
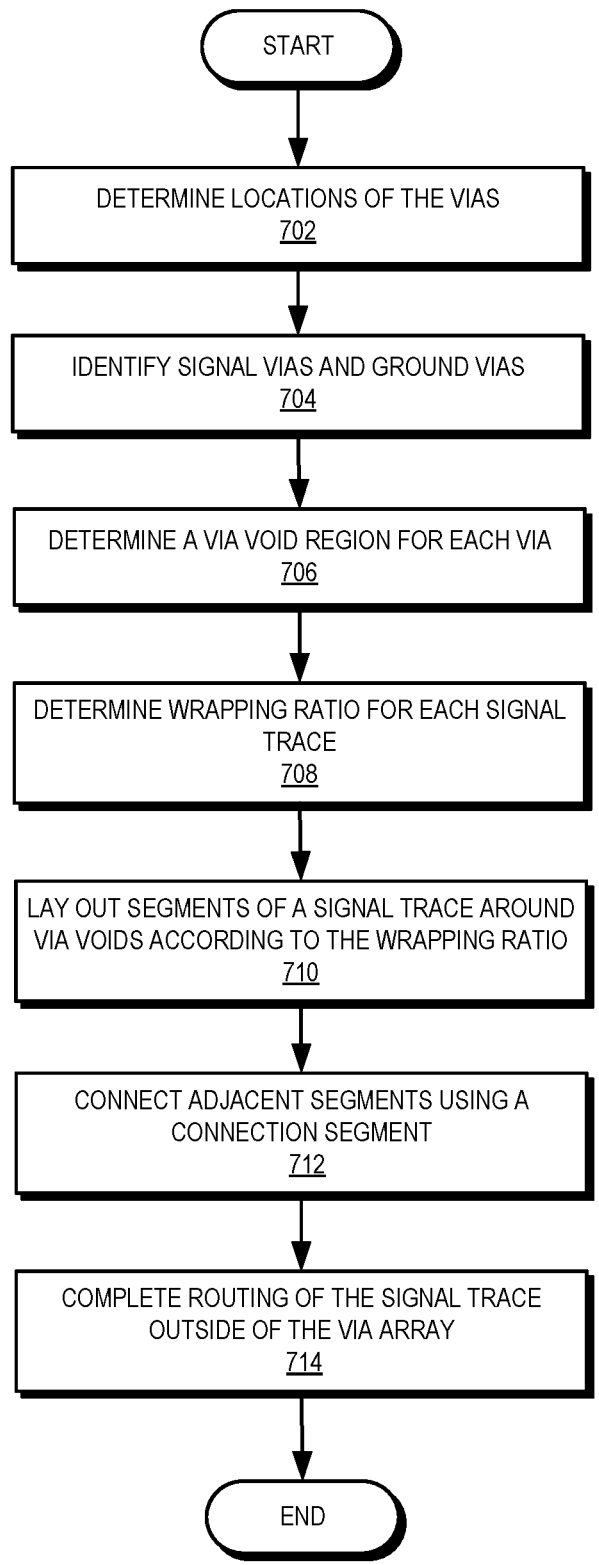
FIG. 7 presents a flowchart illustrating a process of designing escape routing on a PCB, according to one aspect of the instant application.

FIG. 7 presents a flowchart illustrating a process of designing escape routing on a PCB, according to one aspect of the instant application. During operation, one can first determine the locations of the vias (operation 702) and identify which vias are signal vias and which vias are ground vias (operation 704). The via antipad or "keep-out" region of each signal or ground via is then determined (operation 706). Depending on the design, the keep-out region for the signal and ground vias can be same or different. For example, the keep-out region of a ground via can be smaller than that of a signal via.

For each signal trace escaping from the via array, one can determine a wrapping ratio (i.e., the proportion of the perimeter of a via antipad wrapped by the signal trace) (operation 708). According to one aspect, both signal traces within a routing channel can have the same wrapping ratio. According to an alternative aspect, the two signal traces in the same routing can have different wrapping ratios, with one signal trace wrapping a greater portion of each via antipad. In addition, the wrapping ratio can be determined based on the pitches (e.g., row pitch and column pitch) of the via array and the size of the via antipads. A larger pitch and/or smaller via can mean that a smaller wrapping ratio can be used to achieve the desired separation between the traces. Note that it is desirable to have the smallest separation between the signal traces larger than twice or three times the width of the signal trace.

Once the wrapping ratio is determined, the designer can lay out segments of a signal trace around the via antipads (referred to as via-antipad-wrapping segments) according to the determined wrapping ratio (operation 710) and then connect each pair of adjacent via-antipad-wrapping segments using a connection segment to complete the routing of the signal trace escaping out of the SOC footprint (operation 712). A connection segment is typically positioned at the empty space between adjacent via antipads, and its curvature can also be determined based on the pitch of the via array. According to one aspect, the connection segments can be partially widened to reduce the impedance of the signal trace. According to a further aspect, the widened portion of the connection segment can be tapered. The routing of the signal trace outside of the via array can then be completed according to the PCB design (operation 714).

In general, this disclosure provides a technique to reduce the crosstalk within the escape routing of an integrated circuit device on a PCB. More particularly, in situations where signal traces need to escape from a high-density via array of a large SOC device, the long coupling length and close spacing between a pair of signal traces in a routing channel can lead to a higher amount of crosstalk. To reduce the amount of crosstalk, according to a first aspect of the instant application, one signal trace in the routing channel can include a number of via-antipad-wrapping segments, with each via-antipad-wrapping segment wrapping around a substantial portion of a corresponding via antipad. Depending on the desired separation and the pitch of the via array, the wrapped portion of the perimeter of the via antipad (i.e., the wrapping ratio) can vary (e.g., between 0% and 50%, between 25% and 50%, or between 40% and 50%). According to a second aspect, both signal traces in a routing channel can have via-antipad-wrapping segments. The wrapping ratios for the two signal traces can be the same or different. According to a third aspect, the via antipad or 'keep-out" region of signal vias and ground vias can be defined differently. The ground vias can have a smaller "keep-out" region to allow signal traces to be routed closer to the ground vias, thus further increasing separation between signal traces in each routing channel. According to a fourth aspect, at least one signal trace can include one or more widened segments. The widened segments can be located in areas between adjacent via antipads in the same row.

In the disclosed examples (e.g., examples shown in FIGS. 2-6), the signal traces are striplines positioned on an internal layer of the PCB, and the escape routing is used to route the signal traces through a via array. In practice, the same routing technique (e.g., routing a signal trace around a keep-out region by wrapping a segment of the signal trace around a portion of the perimeter of the keep-out region) can be used to route microstrips through an array of contact pads on the top surface routing layer of the PCB. Moreover, in the disclosed examples, the via array is a staggered array. In practice, the same routing technique can be used to route signal traces through an array of vias or contact pads of any formation.

One aspect of the instant application provides a printed circuit board (PCB). The PCB can include a plurality of layers and an array of vias comprising a plurality of rows configured to connect signals across layers. An inner layer of the PCB can include first and second signal traces positioned between first and second adjacent rows of the vias, the first signal trace positioned adjacent to the first row and the second signal trace positioned adjacent to the second row. The first signal trace can include at least one curved segment that curves around a substantial portion of a corresponding via in the first row such that separation between the first and second signal traces varies along the curved segment.

In a variation on this aspect, the curved segment curves along a portion of a perimeter of a via antipad region associated with the corresponding via.

In a further variation, the curved segment curves along between 0% and 50% of the perimeter of the via antipad region.

In a further variation, the corresponding via is a signal via, and the via antipad region of the signal via corresponds to a via antipad on a reference plane associated with the first signal trace.

In a further variation, the corresponding via is a ground via, and the via antipad region of the ground via is smaller than the via antipad region of the signal via.

In a variation on this aspect, the second signal trace can include at least one curved segment that curves around a substantial portion of a corresponding via in the second row.

In a further variation, the curved segment of the second signal trace curves along between 0% and 40% of the perimeter of the via antipad region in the second row.

In a variation on this aspect, at least one signal trace comprises a widened portion at a location where the separation between the first and second signal traces is increased.

In a further variation, the widened portion is positioned between adjacent vias in a same row.

In a variation on this aspect, the PCB can further include a system on a chip (SOC) device comprising an array of contact pads coupled to the array of vias.

One aspect of the instant application provides an inner layer of a printed circuit board (PCB). The inner layer can include an array of vias comprising a plurality of rows configured to connect signals across multiple layers of the PCB and first and second signal traces positioned between first and second adjacent rows of the vias, the first signal trace positioned adjacent to the first row and the second signal trace positioned adjacent to the second row. The first signal trace comprises at least one curved segment that curves around a substantial portion of a corresponding via in the first row such that separation between the first and second signal traces varies along the curved segment.

In a variation on this aspect, the separation between the first and second signal traces at a location between adjacent vias of the first row is greater than the separation between the first and second signal traces at a location between adjacent vias of the second row.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed.

When the hardware modules or apparatus are activated, they perform the methods and processes included within them.

The foregoing descriptions have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A printed circuit board (PCB), comprising:
    a plurality of layers; and
    an array of vias comprising a plurality of rows configured to connect signals across layers, the vias of adjacent rows being arranged in a staggered fashion;
    wherein an inner layer comprises first and second signal traces positioned between first and second adjacent rows of the vias, the first signal trace positioned adjacent to the first row and the second signal trace positioned adjacent to the second row;
    the first signal trace comprising at least one curved segment that curves around a substantial portion of a corresponding via in the first row such that separation between the first and second signal traces varies along the curved segment; and
    the separation between the first and second signal traces increasing toward a first location between adjacent vias in the first row and decreasing toward a second location between adjacent vias in the second row.

2. The PCB of claim 1, wherein the curved segment curves along a portion of a perimeter of a via antipad region associated with the corresponding via.

3. The PCB of claim 2, wherein the curved segment curves along between 25% and 50% of the perimeter of the via antipad region.

4. The PCB of claim 2, wherein the corresponding via is a signal via, and wherein the via antipad region of the signal via corresponds to a via antipad on a reference plane associated with the first signal trace.

5. The PCB of claim 4, wherein the corresponding via is a ground via, and wherein the via antipad region of the ground via is smaller than the via antipad region of the signal via.

6. The PCB of claim 2, wherein the curved segment curves along between 40% and 50% of the perimeter of the via antipad region.

7. The PCB of claim 1, wherein the second signal trace comprises at least one curved segment that curves around a substantial portion of a corresponding via in the second row.

8. The PCB of claim 7, wherein the curved segment of the second signal trace curves along between 25% and 40% of the perimeter of the via antipad region in the second row.

9. The PCB of claim 1, wherein at least one signal trace comprises a widened portion at a location where the separation between the first and second signal traces is increased.

10. The PCB of claim 9, wherein the widened portion is positioned between adjacent vias in a same row.

11. The PCB of claim 1, further comprising:
    a system on a chip (SOC) device comprising an array of contact pads coupled to the array of vias.

12. An inner layer of a printed circuit board (PCB), comprising:
    an array of vias comprising a plurality of rows configured to connect signals across multiple layers of the PCB, the vias of adjacent rows being arranged in a staggered fashion; and
    first and second signal traces positioned between first and second adjacent rows of the vias, the first signal trace positioned adjacent to the first row and the second signal trace positioned adjacent to the second row;
    the first signal trace comprising at least one curved segment that curves around a substantial portion of a corresponding via in the first row such that separation between the first and second signal traces varies along the curved segment; and
    the separation between the first and second signal traces increasing toward a first location between adjacent vias in the first row and decreasing toward a second location between adjacent vias in the second row.

13. The inner layer of claim 12, wherein the curved segment curves along a portion of a perimeter of a via antipad region associated with the corresponding via.

14. The inner layer of claim 13, wherein the curved segment curves along between 25% and 50% of the perimeter of the via antipad region.

15. The inner layer of claim 13, wherein the corresponding via is a signal via, and wherein the via antipad region of the signal via corresponds to a via antipad on a reference plane associated with the first signal trace.

16. The inner layer of claim 15, wherein the corresponding via is a ground via, and wherein the via antipad region of the ground via is smaller than the via antipad region of the signal via.

17. The inner layer of claim 13, wherein the curved segment curves along between 40% and 50% of the perimeter of the via antipad region.

18. The inner layer of claim 12, wherein the second signal trace comprises at least one curved segment that curves around a substantial portion of a corresponding via in the second row.

19. The inner layer of claim 18, wherein the curved segment of the second signal trace curves along between 25% and 40% of the perimeter of the via antipad region in the second row.

20. The inner layer of claim 12, wherein at least one signal trace comprises a widened portion at a location where the separation between the first and second signal traces is increased.

21. The inner layer of claim 20, wherein the widened portion is positioned between adjacent vias in a same row.

* * * * *